United States Patent
Zhang et al.

(10) Patent No.: US 11,116,091 B1
(45) Date of Patent: Sep. 7, 2021

(54) FLEXIBLE DISPLAY SCREEN AND DISPLAY DEVICE

(71) Applicant: WUHAN CHINA STAR OPTOELECTRONICS SEMICONDUCTOR DISPLAY TECHNOLOGY CO., LTD., Wuhan (CN)

(72) Inventors: Zhuo Zhang, Wuhan (CN); Wen Han, Wuhan (CN)

( * ) Notice: Subject to any disclaimer, the term of this patent is extended or adjusted under 35 U.S.C. 154(b) by 0 days.

(21) Appl. No.: 16/963,512

(22) PCT Filed: Jun. 12, 2020

(86) PCT No.: PCT/CN2020/095696
§ 371 (c)(1),
(2) Date: Jul. 21, 2020

(30) Foreign Application Priority Data

Apr. 27, 2020 (CN) .......................... 202010345374.2

(51) Int. Cl.
*H05K 5/02* (2006.01)
*H05K 5/00* (2006.01)

(52) U.S. Cl.
CPC .......... *H05K 5/0217* (2013.01); *H05K 5/0017* (2013.01); *H05K 5/0086* (2013.01)

(58) Field of Classification Search
None
See application file for complete search history.

(56) References Cited

U.S. PATENT DOCUMENTS

| | | | |
|---|---|---|---|
| 9,787,076 B2* | 10/2017 | Li | H05K 7/02 |
| 10,101,019 B2* | 10/2018 | Jahng | F21V 33/0052 |
| 10,111,346 B2* | 10/2018 | Seo | G06F 1/1624 |
| 2008/0144265 A1* | 6/2008 | Aoki | H04M 1/0268 361/679.04 |
| 2010/0182738 A1* | 7/2010 | Visser | G09F 9/372 361/679.01 |
| 2011/0043976 A1* | 2/2011 | Visser | G09F 9/301 361/679.01 |
| 2016/0320804 A1* | 11/2016 | Takayanagi | G06F 1/1679 |
| 2016/0363960 A1 | 12/2016 | Park et al. | |
| 2017/0060183 A1* | 3/2017 | Zhang | G06F 1/1605 |
| 2017/0094785 A1 | 3/2017 | Sun et al. | |
| 2020/0264660 A1* | 8/2020 | Song | G06F 1/1686 |

FOREIGN PATENT DOCUMENTS

| | | |
|---|---|---|
| CN | 105118389 A | 12/2015 |
| CN | 106251779 A | 12/2016 |
| CN | 208044998 U | 11/2018 |
| CN | 208044999 U | 11/2018 |
| CN | 109903679 A | 6/2019 |
| CN | 110534024 A | 12/2019 |

* cited by examiner

*Primary Examiner* — Xanthia C Cunningham

(57) ABSTRACT

The present invention provides a flexible display screen and a display device. The flexible display screen includes a display panel, a reel mechanism, and a support structure. The display panel includes a display surface and a support base away from the display surface. The support base is a stepped structure. The reel mechanism is disposed on a side of the display panel. A part of the display panel is wrapped around inside the reel mechanism. The support structure includes a plurality of support plates.

10 Claims, 3 Drawing Sheets

FLEXIBLE DISPLAY SCREEN AND DISPLAY DEVICE

FIELD OF INVENTION

The present invention is related to the field of display devices, and specifically, to a flexible display screen and a display device.

BACKGROUND OF INVENTION

In general, liquid crystal display devices, plasma display devices, field emission display devices, light-emitting display devices, etc. have been actively researched as flat panel display devices. However, the liquid crystal display devices and the light-emitting display devices have become a focus because they can realize advantages of mass production technology, ease of production of driving components, and high image quality.

Recently, with regard to technical deficiencies of the flat panel display devices, it is particularly necessary to intensify research and development on rollable or foldable display product structures that can attract consumers' attention. A conventional rollable display device includes a display panel capable of displaying an image, and a reel; the display panel is then wrapped around the reel. However, in such a rollable display device, friction and electromagnetic interference generated between every instance of the display panel wrapped around the reel during stretching or rewinding greatly affects lifespan of the display panel.

Therefore, it is necessary to research and develop a flexible display device capable of realizing a rollable display or a foldable display without the above problems.

SUMMARY OF INVENTION

A purpose of the present invention is to provide a flexible display screen and a display device to solve a problem of a short lifespan of a rollable display panel in the prior art.

In order to achieve the above purpose, the present invention provides a flexible display screen. The flexible display screen includes a display panel, at least one reel mechanism, and a support structure. The display panel includes a display surface and a support base away from the display surface. The support base is a stepped structure. The reel mechanism is disposed on a side of the display panel. A part of the display panel is wrapped around inside the reel mechanism. The support structure includes a plurality of support plates.

When the display panel is drawn out, the plurality of support plates in the support structure forms a laminated structure, and a step of the support base of the display panel closest to the reel mechanism is disposed on a topmost layer of the plurality of support plates. When the display panel is expanded, the plurality of support plates in the support structure corresponding thereto is drawn out, and the plurality of support plates drawn out form a stepped structure, which fits the stepped structure of the support base of the expanded display panel, and the display surface of the expanded display panel forms a flat surface.

Furthermore, the flexible display screen further includes a flexible layer. The flexible layer is disposed on the display surface of the display panel. A side of the flexible layer is fixed in the reel mechanism. A length of the display panel is less than a length of the flexible layer.

Furthermore, the reel mechanism includes a reel provided with a spiral winding structure. A side of the flexible layer is fixed to a center of the reel. The display panel and the flexible layer are wrapped into the reel mechanism along the reel.

Furthermore, the reel mechanism further includes at least one coil spring mounted on one end of the reel.

Furthermore, the reel mechanism further includes balls or rollers. The balls or the rollers are disposed on a surface of the reel facing the display panel. A rotation direction of the balls or the rollers is same as a rotation direction of the reel mechanism.

Furthermore, the reel mechanism further includes a housing. The reel is rotationally disposed in the housing. An end of a last layer of the plurality of support plates is connected to the housing. The housing is provided with an opening. The display panel and the flexible layer extend into the reel mechanism through the opening.

Furthermore, the flexible display screen further includes a mid-frame case. The display panel and the support structure are disposed in the mid-frame case, and the display surface is exposed. A side of the flexible layer away from the reel is fixed in the mid-frame case.

Furthermore, the flexible display screen further includes a battery and a motherboard. The battery is disposed in the mid-frame case. The motherboard is disposed in the mid-frame case and is connected to the display panel and the battery.

Furthermore, the display panel further includes a display layer, a touch layer, and a polarizer. The display layer is disposed on the support base. The touch layer is disposed on a surface of the display layer away from the support base. The polarizer is disposed on a surface of the touch layer away from the display layer.

The present invention also provides a display device. The display device includes the flexible display screen as described above.

The flexible display screen and the display device provided by the present invention configure the reel in the reel mechanism to be the spiral winding structure. The display panel is wrapped into the reel along the spiral winding structure of the reel, so that every instance of the display panel wrapped around itself is, thereby reducing friction and electromagnetic interference generated by the display panel wrapped around inside the reel mechanism and extending the lifespan of the display panel. Also, a surface of the display panel facing the support structure is configured to be the stepped structure which fits the support structure, so that a step difference between every two support plates in the support structure is eliminated, and the display surface of the display panel is flattened, thereby improving user experience.

DESCRIPTION OF DRAWINGS

In order to describe technical solutions in the present invention clearly, drawings to be used in the description of embodiments will be described briefly below. Obviously, drawings described below are only for some embodiments of the present invention, and other drawings can be obtained by those skilled in the art based on these drawings without creative efforts.

Figure 1:
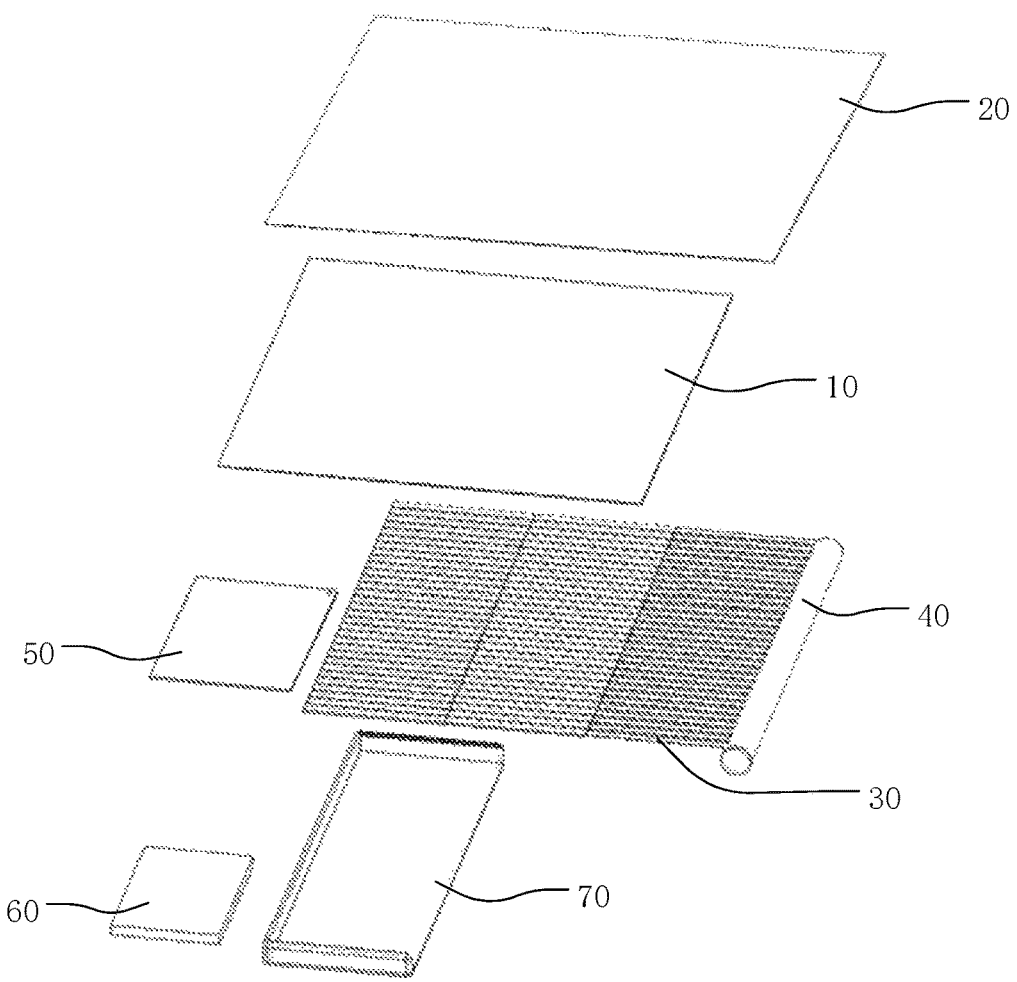
FIG. 1 is a schematic diagram of components of a flexible display screen in an embodiment of the present invention.

REFERENCE SIGNS display panel 10, display layer 11, touch layer 12, polarizer 13, support base 14, adhesive layer 15, pressure sensitive adhesive 16, flexible layer 20, extension end 21, support structure 30, support plate 31, reel mechanism 40, reel 41, coil spring 42, housing 43, shell 44, cap 45, opening 46, motherboard 50, power supply 60, mid-frame case 70.

DETAILED DESCRIPTION OF PREFERRED EMBODIMENTS

A preferred embodiment of the present invention will be introduced with reference to appended drawings as follows to demonstrate that the present invention can be implemented. The embodiment of the present invention can be fully introduced to those skilled in the art to make technical contents clearer and easier to understand. The present invention can be embodied in many different forms of embodiment, and the scope of protection of the present invention is not limited to the embodiments set forth herein.

In the appended drawings, structurally identical components are designated by the same reference numerals, and structurally or functionally similar components throughout are designated by similar numerical reference numerals. The dimensions and thicknesses of each component shown in the drawings are arbitrarily shown. The size and thickness of each component are not limited, and for the sake of clarity, the thickness of the components is exaggerated somewhat in some places in the drawings.

Direction terms mentioned by the present invention, for example "upper," "lower," "front," "rear," "left," "right," "inner," "outer," "side," etc. are merely directions in the appended drawings for only explaining and illustrating the present invention. The orientation or positional relationship is only for the convenience of describing the present invention and simplifying the description, and does not indicate or imply that the device or element referred to must have a specific orientation, structure and operation in a specific orientation, and should not be viewed as limitations of the present invention. In addition, terms "first," "second," and "third" are used for descriptive purposes only, and cannot be understood as indicating or implying relative importance or implicitly indicating the number of technical features indicated.

When some part is described to be "on" another part, the part can be directly disposed on the other part; alternatively, an intervening part can exist, the part is disposed on the intervening part, and the intervening part is disposed on the other part. When a part is described to be "installed on" or "connected to" another part, it can be understood that the parts are directly "installed" or "connected" to each other, alternatively it is understood that one part is "installed" or "connected" to the other part through an intervening part.

An embodiment of the present invention provides a display device. The display device includes a flexible display screen. The flexible display screen provides a display screen for the display device. The display device can be any electronic products or components with a display function, such as mobile phones, laptops, televisions, and so on.

As shown in FIG. 1, the flexible display screen includes a display panel 10, a reel mechanism 40, and a support structure 30.

Figure 3:
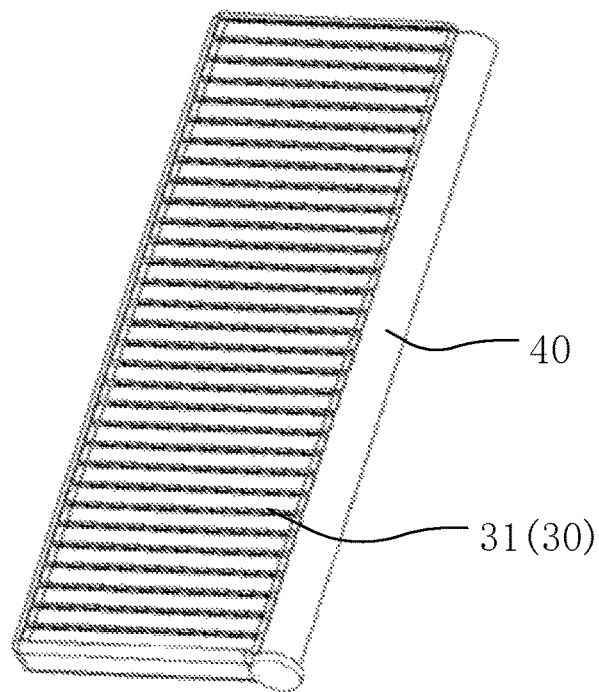
FIG. 3 is a three-dimensional view of a collapsed support structure of the flexible display screen in an embodiment of the present invention.
Figure 4:
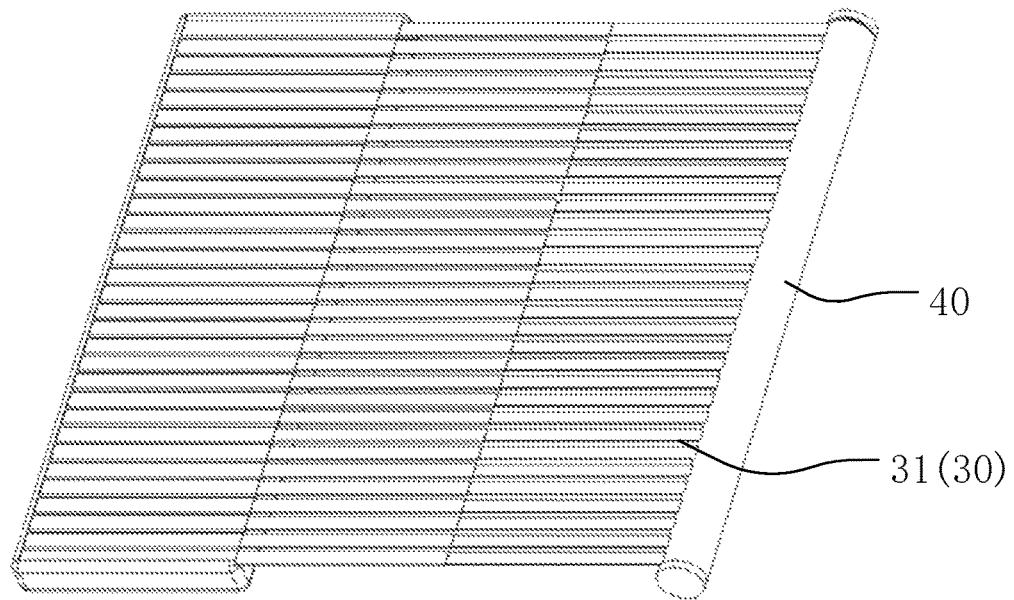
FIG. 4 is a three-dimensional view of an expended support structure of the flexible display screen in an embodiment of the present invention.

The support structure 30 includes three support plates 31, the support plates 31 are laminated atop each other. One or more slide rails are configured to realize movable installation between every two support plates 31, so that a stepped expansion shown in FIG. 2 can be realized between the support plates 31. The slide rails can be section-by-section locking slide rails, so that the support structure 30 can be expanded layer by layer. When the support structure 30 is collapsed, it is shown as in FIG. 3. When the support structure 30 is expanded, it is shown as in FIG. 4.

Figure 2:
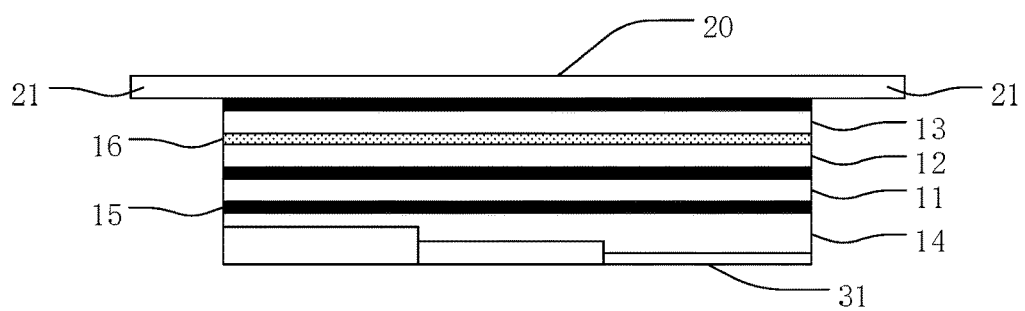
FIG. 2 is a schematic diagram of layers of the flexible display screen in an embodiment of the present invention.

As shown in FIG. 2, the display panel 10 includes a display layer 11, a touch layer 12, a polarizer 13, and a support base 14. The support base 14, the display layer 11, the touch layer 12, and the polarizer 13 are sequentially laminated. A surface of the display panel 10 away from the support base 14 is its display surface. The touch layer 12 is disposed on a surface of the display layer 11. The polarizer 13 is disposed on a surface of the touch layer 12 away from the display layer 11. The display layer 11 and the touch layer 12 can be attached with an optical adhesive, which increases integration and stability between the display layer 11 and the touch layer 12 and prevents peeling. the touch layer 12 and the polarizer 13 can be attached with a pressure sensitive adhesive 16, which increases adhesion between the touch layer 12 and the polarizer 13 without affecting pressure sensing of the touch layer 12. The display layer 11 is configured to emit light and provide a display screen. The touch layer 12 is configured to implement touch control. The polarizer 13 is configured to filter and polarize the light emitted by the display layer 11 to help the display panel 10 to image. The support base 14 is disposed on a surface of the display layer 11 away from the touch layer 12, and it can also be attached to the display layer 11 through an adhesive layer 15. The support base 14 is also disposed on the support plates 31 of the support structure 30. A surface of the support base 14 facing the supporting structure 30 is provided with a stepped structure. Each step in the stepped structure corresponds to each support plate 31 in the support structure 30.

When the display panel 10 is expanded, the support plates 31 in the support structure 30 are drawn out layer by layer with a laminated structure. Also, every two support plates 31 forms a step difference, so that the stepped structure is formed accordingly and fits the stepped structure of the support base 14. A step of the support base 14 of the display panel 10 closest to the reel mechanism 40 is disposed on a topmost layer of the support plates 31, so as to support the display panel 10. In this way, the display surface of the expanded display panel 10 remains unaffected by uneven step differences between the support plates 31, improving user experience.

The flexible display screen further includes a flexible layer 20. The flexible layer 20 is disposed on the display surface of the display panel 10, that is, the flexible layer 20 is disposed on a surface of the polarizer 13 away from the touch layer 12. The flexible layer 20 and the polarizer 13 can be attached with the adhesive layer 15. A length of the flexible layer 20 is greater than a length of the display panel 10, so that two ends of the flexible layer 20 have extension ends 21 longer than the display panel 10.

Figure 5:
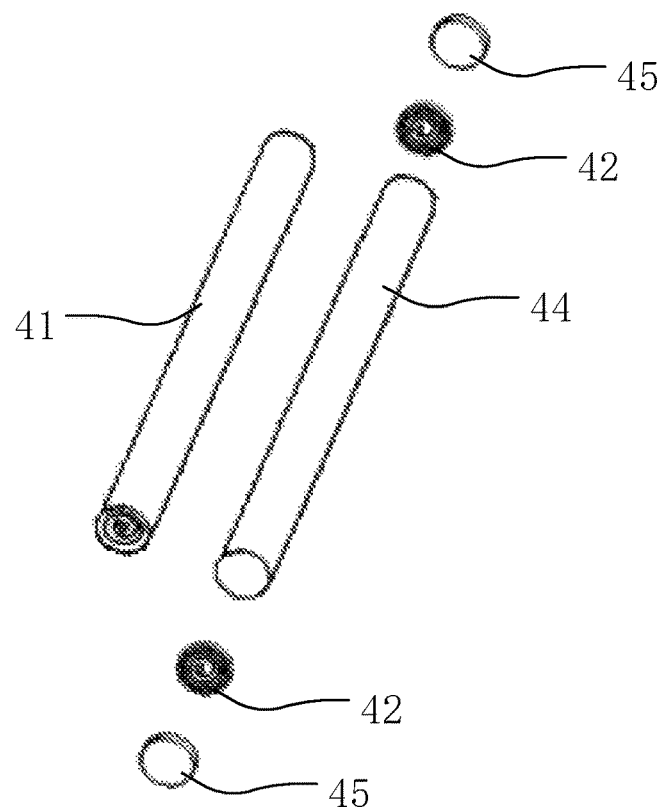
FIG. 5 is a schematic diagram of components of a reel mechanism in an embodiment of the present invention.

The reel mechanism 40 is disposed on a side of the display panel 10. A part of the display panel 10 and the flexible layer 20 are wrapped around inside the reel mechanism 40. As shown in FIG. 5, the reel mechanism 40 includes a reel 41, two coil springs 42, and a housing 43.

Figure 6:
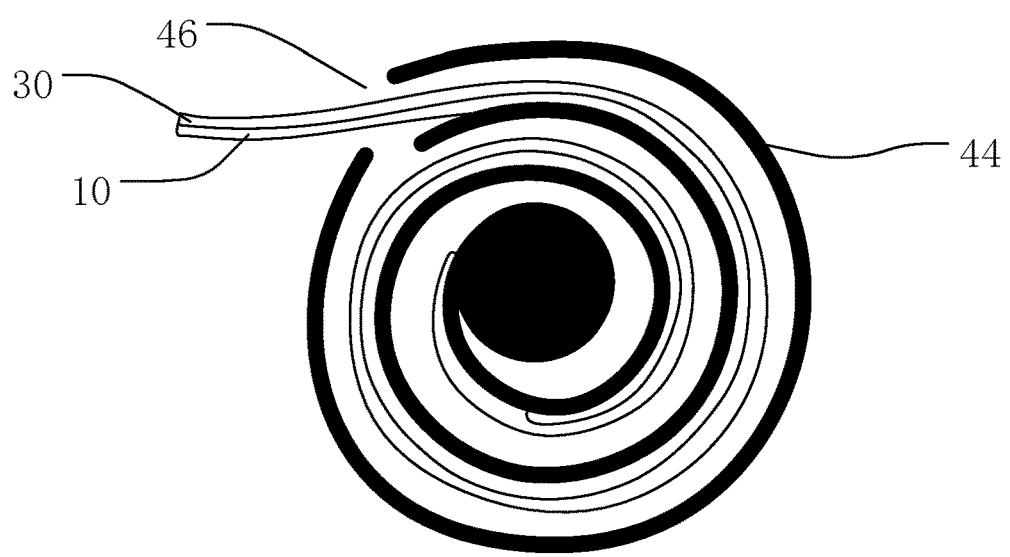
FIG. 6 is a schematic cross-sectional view of the reel mechanism in an embodiment of the present invention.

As shown in FIG. 6, the reel 41 is provided with a spiral winding structure. An extension end 21 of the flexible layer 20 is fixed to a center of the reel 41. A part of the flexible layer 20 and the display panel 10 disposed on the flexible layer 20 are wrapped into the reel 41 along the spiral winding structure of the reel 41. Overlaying instances of the display panel 10 wrapped around the reel 41 are separated by the spiral winding structure and are prevented from contacting each other, thereby reducing friction and electromagnetic interference generated while drawing out the display panel 10 and extending the lifespan of the display panel 10.

In another embodiment of the present invention, a surface of the reel 41 contacting the display panel 10 can be provided with a plurality of rollers. The rollers can be rotationally disposed on the reel 41. A rotation direction of the rollers is same as a rotation direction of the reel 41, which can reduce friction between the display panel 10 and the reel 41, thereby preventing damage due to friction and further extending the lifespan of the display panel 10.

In another embodiment, the rollers can be replaced with balls. A structure of disposing the balls and a rotation direction of the balls are similar to those of the rollers, so they are not described herein. All other embodiments obtained by a person of ordinary skill in the art based on the embodiments of the present invention without creative efforts shall fall within the protection scope of the present invention.

The two coil springs 42 are respectively mounted on two ends of the reel 41. When the flexible display screen is drawn out, the flexible layer 20 and the display panel 10 extend outward from the reel 41 and drive the reel 41 to rotate. The reel 41 drives and tensions the coil springs 42, which generates a reaction force opposite to a rotation direction of the reel 41. The reaction force can tension the flexible layer 20 when the flexible display screen is expanded, and the display panel 10 disposed under the flexible layer 20 is also under tension, so that display images does not wrinkle. When the flexible display screen is collapsed, the reaction force of the coil spring 42 drives the reel 41 to rotate, so that the flexible layer 20 and the display panel 10, which are drawn out, are rewrapped into the reel 41.

The reel 41 and the coil springs 42 are rotationally disposed in the housing 43. The housing 43 includes a shell 44 and two caps 45. The shell 44 is a hollow cylinder. The two caps 45 are respectively disposed on two ends of the shell 44. The shell 44 of the housing 43 is provided with an opening 46. The flexible layer 20 and the display panel 10 extend into the reel mechanism 40 through the opening 46. An end of a last layer of the support plates 31 is disposed under the opening 46. Thus, when the display panel 10 is expanded by the reel mechanism 40, the support plates 31 can also be driven to expand at the same time. The housing 43 is configured to protect and support the reel 41 and the coil springs 42.

The flexible display screen further includes a motherboard 50, a power supply 60, and a mid-frame case 70. The motherboard 50, the power supply 60, and the display panel 10 are electrically connected to each other. the motherboard 50 is configured to control the display panel 10 to display images. The power supply 60 is configured to provide operating energy. The display panel 10 and the support structure 30 are disposed in the mid-frame case 70. An extension end 21 of the flexible layer 20 away from the reel mechanism 40 is fixed in the mid-frame case 70. The display surface is exposed. The motherboard 50 and the power supply are also disposed in the mid-frame case 70.

The flexible display screen and the display device provided by the present invention configure a surface of the display panel 10 facing the support structure 30 to be the stepped structure which fits the support structure 30, so that a step difference between every two support plates 31 in the support structure 30 is eliminated, and the display surface of the display panel 10 is flattened, thereby improving user experience. Also, the reel 41 in the reel mechanism 40 is configured to be the spiral winding structure. The display panel 10 is wrapped into the reel 41 along the spiral winding structure of the reel 41, so that every instance of the display panel 10 wrapped around itself is not in contact with each other, thereby reducing friction and electromagnetic interference generated by the display panel 10 wrapped around inside the reel mechanism 40 and extending the lifespan of the display panel 10. In addition, the rollers or the balls are also disposed on a contact surface between the reel 41 and the display panel 10 to reduce friction between the display panel 10 and the reel 41, preventing scratch damage and further extending lifespan of the flexible display screen.

Although the present invention herein has been described with reference to particular embodiments, it should be understood that these embodiments are merely illustrative of the principles and applications of the present invention. It is therefore to be understood that numerous modifications can be made to the illustrative embodiments and that other arrangements can be devised without departing from the spirit and scope of the present invention as defined by the appended claims. It will be appreciated that the various dependent claims and the features set forth therein can be combined in different ways than presented in the initial claims. It will also be appreciated that the features described in connection with individual embodiments can be shared with others of the described embodiments.

What is claimed is:

1. A flexible display screen, comprising:
    a display panel comprising a display surface and a support base away from the display surface, wherein the support base is a stepped structure;
    at least one reel mechanism disposed on a side of the display panel, wherein a part of the display panel is wrapped around inside the reel mechanism; and
    a support structure comprising a plurality of support plates;
    wherein when the display panel is drawn out, the plurality of support plates in the support structure forms a laminated structure, and a step of the support base of the display panel closest to the reel mechanism is disposed on a topmost layer of the plurality of support plates; and
    wherein when the display panel is expanded, the plurality of support plates in the support structure corresponding thereto is drawn out, and the plurality of support plates drawn out form a stepped structure, which fits the stepped structure of the support base of the expanded display panel, and the display surface of the expanded display panel forms a flat surface.

2. The flexible display screen according to claim 1, further comprising:
    a flexible layer disposed on the display surface of the display panel;
    wherein a side of the flexible layer is fixed in the reel mechanism, and a length of the display panel is less than a length of the flexible layer.

3. The flexible display screen according to claim 2, wherein the reel mechanism comprises:
   a reel provided with a spiral winding structure;
   wherein a side of the flexible layer is fixed to a center of the reel, and the display panel and the flexible layer are wrapped into the reel mechanism along the reel.

4. The flexible display screen according to claim 3, wherein the reel mechanism further comprises:
   at least one coil spring mounted on one end of the reel.

5. The flexible display screen according to claim 3, wherein the reel mechanism further comprises:
   balls disposed on a surface of the reel facing the display panel; or
   rollers disposed on a surface of the reel facing the display panel;
   wherein a rotation direction of the balls or the rollers is same as a rotation direction of the reel mechanism.

6. The flexible display screen according to claim 3, wherein the reel mechanism further comprises:
   a housing;
   wherein the reel is rotationally disposed in the housing, and an end of a last layer of the plurality of support plates is connected to the housing; and
   wherein the housing is provided with an opening, and the display panel and the flexible layer extend into the reel mechanism through the opening.

7. The flexible display screen according to claim 2, further comprising:
   a mid-frame case;
   wherein the display panel and the support structure are disposed in the mid-frame case, and the display surface is exposed; and
   wherein a side of the flexible layer away from the reel is fixed in the mid-frame case.

8. The flexible display screen according to claim 7, further comprising:
   a battery disposed in the mid-frame case; and
   a motherboard disposed in the mid-frame case and connected to the display panel and the battery.

9. The flexible display screen according to claim 1, wherein the display panel further comprises:
   a display layer disposed on the support base;
   a touch layer disposed on a surface of the display layer away from the support base; and
   a polarizer disposed on a surface of the touch layer away from the display layer.

10. A display device, comprising the flexible display screen according to claim 1.

* * * * *